United States Patent [19]

Chen et al.

[11] Patent Number: 4,825,280
[45] Date of Patent: Apr. 25, 1989

[54] ELECTROSTATIC DISCHARGE PROTECTION FOR SEMICONDUCTOR DEVICES

[75] Inventors: Kueing L. Chen; Roland H. Pang, both of Plano, Tex.

[73] Assignee: Texas Instruments Incorporated, Dallas, Tex.

[21] Appl. No.: 914,208

[22] Filed: Oct. 1, 1986

[51] Int. Cl.$^4$ .................. H01L 23/48; H01L 29/46
[52] U.S. Cl. .................................. 357/71; 357/23.13; 357/51
[58] Field of Search ............... 357/71, 51, 23.1, 23.6, 357/23.4, 23.12, 23.13

[56] References Cited

U.S. PATENT DOCUMENTS 4,605,980  3/1984  Hartranft et al. ............... 357/23.13

Primary Examiner—Robert S. Macon
Attorney, Agent, or Firm—Thomas R. FitzGerald; Leo N. Heiting; Melvin Sharp

[57] ABSTRACT

Protection against damage due to electrostatic discharge is provided by the addition of elongate conductor ballast resistor strips (18, 20, 22) formed in series with the transistor device (10). The material forming the conductor strips (18, 20, 22) includes a positive temperature coefficient, thereby offsetting the negative temperature coefficient of the semiconductor material forming the transistor (10). Plural conductor strips are arranged in parallel to reduce the overall resistance to the transistor (10). High current density areas are prevented by providing a plurality of sub-transistors (48) formed in plural individual moats (40-46). The individual current paths reduce the formation of filaments caused by the high concentrations of current in a small area.

39 Claims, 1 Drawing Sheet

ELECTROSTATIC DISCHARGE PROTECTION FOR SEMICONDUCTOR DEVICES

TECHNICAL FIELD OF THE INVENTION

The present invention relates in general to transient protectors for semiconductor circuits, and more particularly relates to methods and circuits for protecting semiconductor circuits from the damaging effects of electrostatic discharges.

BACKGROUND OF THE INVENTION

Metal oxide silicon field effect transistors (MOSFETs) are high impedance, low current devices, and thus are particularly susceptible to damage by electrostatic discharges. Electrostatic discharges ranging from a few volts to many thousands of volts can be coupled to a packaged integrated circuit by simply handling the devices. The discharge can be transferred through either the input or output terminals of the device. The output terminals of an integrated circuit are particularly susceptible to damage from electrostatic discharge, as such outputs are characterized by a low secondary breakdown voltage. The inputs of a MOSFET integrated circuit cannot withstand high input voltages because of the low voltage breakdown characteristics of the thin gate insulator material.

Conventional field effect transistors comprising the outputs of an integrated circuit are typically constructed with spaced-apart N-type drain and source regions formed in the face of a semiconductor material. The gate insulator and conductor bridge the regions on top surface of the semiconductor material. Metallic source and drain conductors, generally formed of aluminum, typically make contact directly to the respective semiconductor regions. The bulk resistance of each semiconductor region has heretofore provided the only means of limiting large currents resulting from electrostatic discharges. The bulk resistivity of the source and drain regions are somewhat effective in limiting electrostatic discharge currents, and represent an economical and easily fabricated mechanism for protection against the effects of electrostatic discharges. In some instances, the metallic conductors are spaced apart as much as possible from the edge of the polysilicon to thereby increase the bulk resistance between the conductor and the junction.

However, even though electrostatic currents can be limited to safe magnitudes, semiconductor region imperfections can often form centers or areas of high current densities. The high current density can heat the semiconductor area to its eutectic temperature and form a melted filament, thus destroying the device. The uncontrolled heating of semiconductor materials is also detrimental as thermal runaway may result. That is, due to the negative temperature coefficient of semiconductor material, an increase in temperature reduces its bulk resistance and it can then support an increased current flow. It is apparent that high temperatures resulting from large electrostatic currents can cause the self destruction of the device.

With the trend toward high density integrated circuit chips, the foregoing electrostatic protection technique has been unintentionally obviated in favor of other advantages. Particularly, many MOSFET transistors used as output devices of integrated circuits include aluminum contacts formed on silicide-covered source and drain regions. The silicide covering is highly conductive so that other circuit connections can be easily formed in contact with the respective source or drain regions of the transistor. However, since the electrostatic discharge current will then flow through the low resistance of the silicide layer, the bulk resistivity of the source and drain semiconductor regions can no longer provide the mechanism for limiting discharge current. Therefore, the MOSFET transistor is left essentially with no electrostatic discharge protection. Moreover, the aluminum material has a much lower melting point than that of the underlying semiconductor region, and thus high electrostatic discharge currents can melt the aluminum material, causing it to diffuse through the thin semiconductor region and short circuit the junction.

From the foregoing, it can be seen that a need exists for a method and structure for reliably assuring that a MOSFET transistor is protected against damage from high voltage electrostatic discharges. There is an associated need for electrostatic discharge protection used in connection with high current output MOSFET devices which are typically characterized by low breakdown voltages.

SUMMARY OF THE INVENTION

In accordance with the present invention, the disclosed electrostatic discharge protection method and structure reduces or eliminates the disadvantages and shortcomings associated with the prior art devices. According to the electrostatic discharge protector of the invention, an output transistor comprises a plurality of parallel-connected current sharing sub-transistors, each with a positive temperature coefficient conductor strip connected between the respective source and drain regions to a contact pad. With this arrangement, the top surfaces of the semiconductor regions can be silicided, with a current limiting ballast resistor formed by the elongated connector strips associated with each sub-transistor. The resistance strips are formed on a thermally poor conductor, such as silicon dioxide, so that the positive temperature coefficient effects of the strip can attain their maximum effect.

The technical advantage of the positive temperature coefficient conductor strip feature is that the thermal runaway effect caused by the negative temperature coefficient of the semiconductor material is thereby offset. Hence, electrostatic discharge currents are self-limited by the positive temperature coefficient conductor strips. Also, the chances of filament formation in the semiconductor regions as a result of electrostatic discharge is reduced.

The possibility of filament formation due to electrostatic discharges is also reduced by forming a number of parallel-connected sub-transistors associated with each elongate source conductor strip and each elongate drain conductor strip. The source and drain conductor strips of each sub-transistor are arranged so that the resistance of the current path through each sub-transistor is substantially identical. The current conducted by each sub-transistor is thus substantially equal, and the possibility of excess or high current centers, and the attendant formation of a filament, is thereby reduced.

A plurality of semiconductor moats are formed in a substrate in which a corresponding plurality of sub-transistors are formed. Each sub-transistor provides a conduction path for a portion of the overall output transistor current, the collective currents representing the total current of the output transistor. Independent current paths through each of the sub-transistors provide the technical advantage of reducing high current centers which can give rise to the formation of filaments.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts throughout the views, and in which.

DETAILED DESCRIPTION OF THE INVENTION

Figure 1:
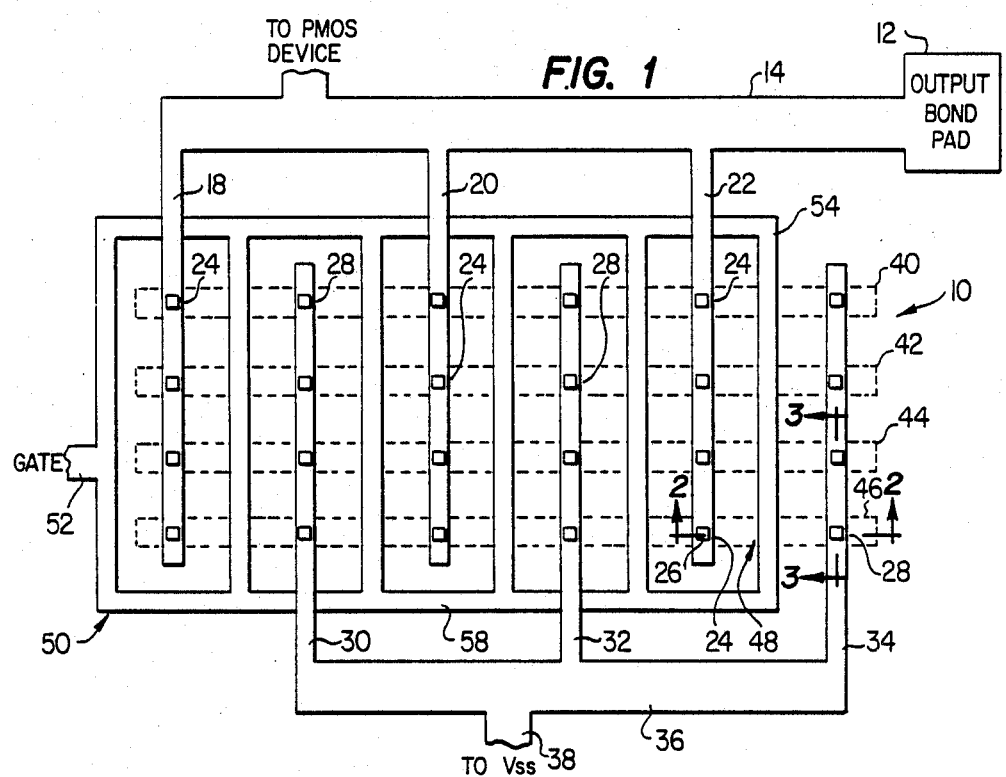
FIG. 1 is a layout of a MOSFET transistor of the present invention, illustrating the elongate source and drain conductor strips forming the ballast resistance to the transistor.

Referring first to FIG. 1, there is illustrated an insulated gate field effect transistor 10 which is adapted as an output device for an integrated circuit. The transistor 10 is fabricated to provide sufficient current drive to other circuits to which the output of the integrated circuit is connected. It should be understood at the outset that transistor 10 is only exemplary of the principles and concepts of the invention, and is not to be limited to the specific device disclosed. For example, the principles disclosed herein of protecting semiconductor devices from electrostatic discharges can be applied to P-channel devices as well as to NPN and PNP bipolar transistors, or even to passive semiconductor devices such as capacitors.

As noted above, electrostatic discharges are generally coupled to the chip of a packaged integrated circuit by the external input/output terminals. An output bond pad 12 illustrates a contact structure which serves to complete a connection from a terminal external to the internal circuits of the integrated circuit chip. While not shown, the output bond pad 12 is normally connected to an external terminal by a thermal or stitch bonded interconnection.

Electrical connection is made from the output bond pad 12 to the output transistor 10 by a conductor bus 14. The conductor bus 14 is typically characterized by a low resistance, and is formed by conventional semiconductor deposition or sputtering processes. The conductor bus 14 can be branched at branch 16, to another device, such as a P-channel transistor, as noted. Extending from the conductor bus 14 are plural elongate conductor strips 18-22 for connecting to a corresponding plurality of semiconductor drain regions of the transistor 10, each forming a part of a sub-transistor of the output transistor 10. Transistor drain regions associated with the elongate conductor strips 18-22 are identified by reference character 24. Each elongate conductor strip includes a plurality of contacts in electrical connection with an underlying semiconductor region, such as identified by contact 26 associated with elongate conductor strip 22.

Importantly, conductor strips 18-22 are elongate to exhibit a predefined resistance between the output bond pad 12 and the associated semiconductor drain regions 24. Moreover, the elongate conductor strips 18-22 are fabricated with a material having a positive temperature coefficient, such that increases in the current magnitude therethrough are countered by the corresponding increases in the resistance of each such conductor strips 18-22. The technical advantage of providing a uniform and predefined resistance for each elongate conductor element 18-22 is that a proportionate amount of current flows through each such conductor element 18-22, and thus the distribution of current into the transistor 10 through plural paths is uniform. High current density locations due to overload currents at transistor drain locations having imperfections are less likely to form, and thus the prevention of filaments is achieved.

The output transistor 10 includes a plurality of sub-transistor semiconductor source regions, such as region 28 underlying the elongate source conductor strip 34. A second set of plural elongate source conductors 30-34 is provided for resistively connecting a source conductor bus 36 to the respective semiconductor source regions 28 of the output transistor 10. In the preferred form of the invention, the elongate source conductor strips 30-34 exhibit substantially the same resistive characteristics as drain conductor strips 18-22. However, it should be appreciated that a substantial amount of electrostatic discharge protection can be afforded by utilizing only the drain conductor strips 18-22.

The elongate drain conductor strips 18-22 are essential to electrostatic protection of the exemplary output transistor 10, as such transistor is connected through the strips 18-22 to the output bond pad 12, and thus to the external terminals of the integrated circuit. However, should the possibility exist of an electrostatic discharge being coupled to the source conductor bus 36, electrostatic discharge protection can be provided by the use of the elongate source conductor strips 30-34. Electrostatic protection on the devices connected to the $V_{ss}$ bus 38 is desirable to protect such semiconductor elements should a high voltage be applied to the $V_{ss}$ voltage bus 38.

For an N-channel MOSFET output transistor 10, the source conductor bus 36 may be branched at 38 and connected to the $V_{ss}$ supply voltage. While not a necessity, the conductor buses 14 and 36 are fabricated with a very low resistance which is relatively insignificant with respect to that of the associated elongate conductor strips 18-22 and 30-34. In this manner, the resistance from the output bond pad 12 to the beginning of each elongate drain conductor strip 18-22 is essentially the same. Thus, the conductor strip 22 which is closer to the output bond(pad 12 does not carry more current than that of a more remotely located conductor strip, such as 18. This feature enhances the equalization of current sharing through the separate elongate strips and thus the reduced possibility of the formation of filaments in the semiconductor regions of the output transistor 10.

The output transistor 10 is further provided with a plurality of P-type semiconductor moats 40-46. Within each moat there is associated a single sub-transistor at a location where the associated pair of source and drain conductor strips cross thereover. For instance, an N-channel sub-transistor 48 is formed in the moat 46 at a location where the drain and source semiconductor regions 26 and 28 are connected to the respective paired elongate conductor strips 22 and 34. With three pairs of associated drain and source conductor strips 18 and 30, 20 and 32, and 22 and 34, and with four independent moats 40-46, a total of 12 individual sub-transistors, similar to transistor 48, are provided.

Any number and configuration of sub-transistors may be utilized to suit the particular needs of the user. Significantly, an independent conduction channel is provided for each sub-transistor associated with each pair of elongate conductor strips. A plurality of current paths thus exist through each sub-transistor. As a result, the current conducted by the output transistor 10 is split up into many independent conduction paths, and the formation of a filament during an electrostatic discharge to bond pad 12 is thereby reduced.

A transistor gate structure 50 is routed between each source and drain conductor strip of the paired strips to provide the gate conductor of each of the twelve sub-transistors. The gate structure 50 includes a branched arm 52 which is connected to other circuits (not shown) for driving the output transistor 10. Since the gate conductors of each of the twelve sub-transistors are connected in common, all sub-transistors are simultaneously controlled. The gate structure 50 includes a plurality of legs 54 which are formed parallel with the conductor strips 22 and 34, and transverse to the moats 40-46. Each leg 54 is shorted together at its opposing ends by elongate gate members 56 and 58, the entire gate structure thus resembling a ladder.

Figure 2:
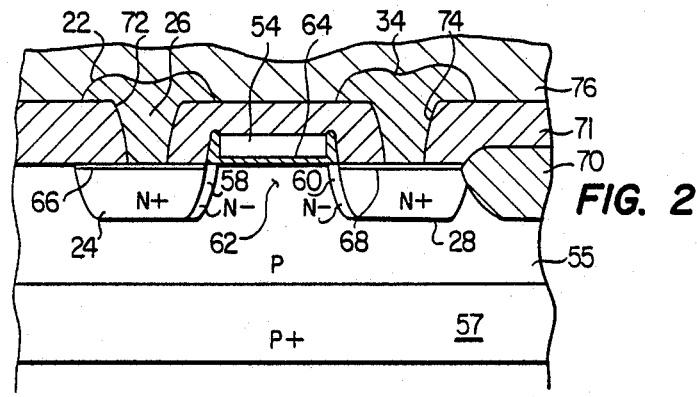
FIG. 2 is a sectional view of a sub-transistor, taken along line 2—2 of FIG. 1.

FIG. 2 illustrates a sectional view of the sub-transistor 48 taken generally along section lines 2—2, comprising a portion of the N-channel output transistor 10. The sub-transistor 48 includes a moat 46 with heavily N+ doped drain 24 and source 28 regions. The moat 46 is formed in a P epitaxial layer 55 which is formed on a P+ substrate 57. The sub-transistor 48 is of the graded junction type, having lightly doped areas 58 and 60 for reducing the hot electron effect. In the preferred form of the invention, the gate conductor 54, and thus the gate structure 50, is constructed of a doped polycrystalline silicon and is separated from the sub-transistor conduction channel 62 by a thin silicon dioxide insulator 64. The drain and source regions 24 and 28 each include a respective silicide layer 66 and 68 formed over the face of such semiconductor regions. Because the invention does not depend upon the ballast resistivity of the semiconductor source and drain regions for protection against electrostatic discharge, the silicide layers 66 and 68 can still be used for providing an improved contact to the underlying semiconductor regions 24 and 28 without degrading electrostatic discharge protection.

A thick field oxide 70 provides electrical isolation between the moats. A multilayer dielectric silicon oxide 71 covers the surface of the wafer, including the gate conductor ladder structure 50. Openings 72 and 74 are formed in the multilayer oxide 71 and the surface thereof is covered with a conductor material for forming the elongate conductor strips 22 and 34. The conductor material is patterned to define the respective pairs of elongate conductor strips, each of which is also formed into a respective opening 72 and 74 and in contact with the underlying silicided semiconductor drain and source regions 24 and 28. The silicide interface 66 and 68 is also highly conductive and thus provides an electrical connection from the respective elongate conductor strips to the underlying semiconductor source or drain region. A passivating layer 76 of insulating material completely covers the wafer, thereby protecting the underlying conductors and semiconductor regions from the environment.

Figure 3:
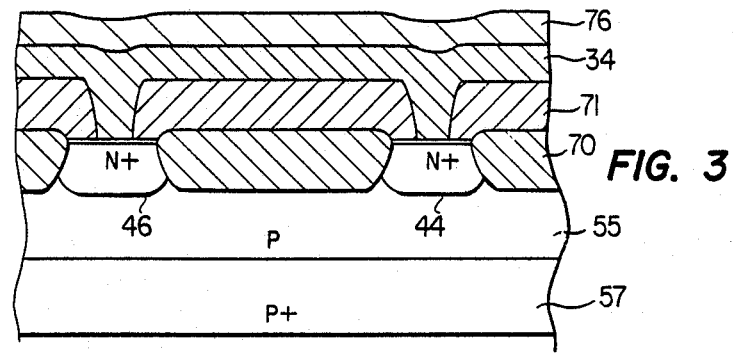
FIG. 3 is a sectional view of a portion of a conductor strip, taken along line 3—3 of FIG. 1.

The sectional view of FIG. 3 illustrates the elongate source conductor strip 34, which makes contact with a semi-conductor source region of one sub-transistor located in each of the underlying moats 40-46. The elongate source conductor strip 34 is insulated from the wafer on the bottom thereof by the thick multilayer oxide 71 and on the top by the passivating layer 76. The heat generated by a large electrostatic discharge current is thus not quickly dissipated, and the corresponding increase in the temperature of the conductor strip 34 raises its resistance. With increased resistance, less current flows and the circuit becomes self-protecting. This effect offsets the negative temperature coefficient of the transistor semiconductor material inherent in the source and drain regions and the moats. Essentially, the thermal runaway tendency normally encountered by increased semi-conductor currents is offset by the limited currents caused by the increased temperature of the elongate conductor strips.

The foregoing discloses the general principles and concepts of the invention for protecting circuits against damage by electrostatic discharge. When both elongate source and drain conductor strips are utilized, the resistance of the current path traversed through each associated sub-transistor is the same. For instance, for electrostatic current flowing in the drain conductor strip 18 and laterally to the right through moat 40, and downwardly through source connector strip 30 experiences the same resistance value as the current through the same conductor strips 18 and 30, but laterally through the bottom moat 46.

By carefully controlling the cross-sectional area of each elongate conductor strip, the resistances thereof can be equalized so that the current sharing for each of the 12 sub-transistors is optimized. No one sub-transistor thereby conducts substantially more current than the others which could give rise to the formation of the noted filaments. For increased resistances, various materials may be selected which have high sheet resistances. Also, the elongate conductor strips can be formed in a serpentine manner for added resistance.

The temperature and resistance relationship of most conductive materials, such as metals, is defined by the equation: $R = R_o(1 + \sigma \Delta T)$ where $R_o$ is the sheet resistance, and $\sigma$ is the temperature coefficient which is positive for conductive metals. For aluminum, $\sigma = 0.00429/°C$. and for titanium silicide ($TiSi_2$), $\sigma = 0.0043/°C$. For a temperature increase of about 100° C., the resistance of aluminum and titanium silicide will thus increase about 43%. This represents a substantial decrease in a current surge which generates the temperature increase. Furthermore, by thermally insulating the elongate conductive strips with, for example, silicon dioxide ($SiO_2$), the heat generated by the increased current flow in the elongate conductor strips is maintained concentrated therein. Optimum effect of the positive temperature coefficient of the conductor strips is thereby achieved.

Normally, it is undesirable to add series resistance in current driving devices, such as the output transistor 10 of FIG. 1. However, by providing a number of elongate conductor strips in parallel, such as strips 18, 20, and 22, the overall resistance can be maintained at a low value. For example, if the metallic resistance for coupling currents to the output transistor 10 were desired to be maintained no greater than one ohm, and if it were desired to insert 10 ohms series resistance within each such elongate conductor strip, then ten such parallel conductor strips would needed. The resultant parallel resistance would then be one ohm, as initially desired.

As is well known in the the art, the resistance of a conductor path is inversely proportional to the cross-sectional area thereof, and directly proportional to the length of the conductor. Thus, conductor strips of varying desired resistances can be formed by appropriately forming the conductor strips with a desired width, thickness and length. Metals ideally useful for the invention and compatible with semiconductor formation processes comprise aluminum, titanium, tungsten, and silicides thereof.

TECNICAL ADVANTAGES OF THE INVENTION

From the foregoing, a method and structure are disclosed for protecting a circuit against damage from an electrostatic discharge. The technical advantage afforded the invention prevents a damaging flow of electrostatic discharge current by inserting a ballast resistor in series with the device. The ballast resistor is preferably formed of a conductor strip having a positive temperature coefficient so that increased temperatures caused by higher currents resist further increases in the current. The positive temperature coefficient of the ballast resistors also offset the negative coefficient characteristic of the semiconductor devices.

Another technical advantage provided by the invention allows for the insertion of the ballast resistor in series with the output transistor, without substantially adding to the overall series resistance. Plural sub-transistors forming the output transistor are connected by parallel elongate conductor strips having the ballast resistance. While each ballast resistor is effective to limit the current to the respective circuit, the parallel arrangement of ballast resistors does not appreciably increase the series resistance to the circuit being protected from electrostatic discharges.

An additional technical advantage provided by the invention reduces filament formation by providing plural equal resistance current paths through the output transistor device to prevent large concentrations of current in a small area.

While the preferred embodiment of the invention has been disclosed with reference to a specific electrostatic protection method and structure, it is to be understood that many changes in detail may be made as a matter of engineering choices without departing from the spirit and scope of the invention, as defined by the dependant claims.

What is claimed is:

1. An electrostatic discharge protected semiconductor device, comprising:
   a bond pad used for connecting the semiconductor device to circuits external thereto; and
   a plurality of resistive conductor strips connected in parallel between said bond pad and the semiconductor device, each said conductor strip being constructed of a material which exhibits a positive temperature coefficient with respect to resistance, and having a resistance substantially identical to the other conductor strips.

2. The electrostatic discharge protected device of claim 1 wherein each said conductor strip is formed over a thermally insulating material.

3. The electrostatic discharge protected device of claim 2 wherein each said conductor strip is formed under a thermally insulating material.

4. The electrostatic discharge protected device of claim 1 further including a silicide layer formed between each said conductor strip and the semiconductor device.

5. The electrostatic discharge protected device of claim 1 wherein said conductor strips comprise a input set of conductors to the device, and further including a set of output resistive conductor strips connected to the semiconductor device.

6. The electrostatic discharge protected device of claim 5 wherein said input set of conductors and said output set of conductors each include substantially equal resistances.

7. The electrostatic discharge protected device of claim 6 wherein said input set of conductors and said output set of conductors are arranged with respect to the semiconductor device such that a plurality of current paths are formed from the said input set of conductor strips through the device and to said output set of conductor strips.

8. The electrostatic discharge protected device of claim 7 wherein said input and output set of conductor strips are arranged with respect to said semiconductor device such that each said current path is of substantially the same resistance.

9. An insulated gate field effect transistor having electrostatic discharge protection, comprising:
   a semiconductor source region, a semiconductor drain region, and a conduction channel therebetween;
   a gate conductor isolated from said conduction channel;
   a source and drain conductor electrically contacting the respective semiconductor source and drain regions; and
   a resistance of a desired amount external to said source and drain region for limiting electrostatic discharge current to a desired amount such that damage to said transistor does not result.

10. The transistor of claim 9 wherein said resistance is in one of said source or drain conductors.

11. The transistor of claim 9 wherein said resistance is in said drain and source conductors.

12. The transistor of claim 9 wherein said resistance comprises an elongate conductor strip having a desired resistance to effect said protection.

13. The transistor of claim 9 wherein said resistance comprises a conductor strip having a positive temperature coefficient.

14. The transistor of claim 9 further including a silicide interface between said source and drain conductors and the respective said semiconductor source and drain regions.

15. The transistor of claim 9 wherein said transistor comprises a plurality of substantially identical parallel-connected sub-transistors.

16. The transistor of claim 15 wherein each said sub-transistor is connected to a substantially identical resistance for limiting current therethrough.

17. The transistor of claim 15 further including a plurality of electrically independent semiconductor moats, and ones of said sub-transistors are located within said moats.

18. The transistor of claim 9 wherein said resistance includes elongate members which are thermally isolated from adjacent members.

19. The transistor of claim 9 wherein said resistance comprises a plurality of conductor strips each of substantially identical resistance and each connected to a conductor bus of a very low resistivity.

20. An output insulated gate field effect transistor having electrostatic discharge protection, comprising:
   a plurality of elongate parallel semiconductor moats;
   a plurality of paired source and drain regions in each said moat, said pairs of regions defining a corresponding plurality of sub-transistors;
   a plurality of gate conductors disposed transverse to said semiconductor moats and disposed between the regions of said paired source and drain regions, said gate conductors being connected together;
   a plurality of elongate drain conductor strips disposed transverse to said moats and connected to ones of said semiconductor drain regions, each said drain conductor strip having a resistive portion for limiting electrostatic current; and
   a plurality of elongate source conductor strips disposed transverse to said moats and connected to ones of said semiconductor source regions, each said source conductor strip having a resistive portion for limiting electrostatic current.

21. The transistor of claim 20 wherein said source and drain conductor strips comprise a material having a positive temperature coefficient.

22. The transistor of claim 20 wherein said semiconductor source and drain regions each include a silicide interface between the respective semiconductor regions and the respective conductor strips.

23. The transistor of claim 20 further including a low resistance bus to which each drain conductor strip is connected.

24. The transistor of claim 20 further including a low resistance bus to which each source conductor strip is connected.

25. The transistor of claim 20 wherein said gate conductors are each connected to each other at the opposing ends thereof.

26. A method of protecting a semiconductor device from the effects of electrostatic discharges, comprising the steps of:
   forming a controlled resistance of a desired value from a material having a positive temperature coefficient with respect to resistance to limit the current of an electrostatic discharge; and
   connecting the controlled resistance between the semiconductor device and a terminal to which said electrostatic discharges can be applied.

27. The method of claim 26 further including forming said controlled resistance as plural parallel conductor strips each with essentially the same resistance.

28. The method of claim 27 wherein said plural parallel conductor strips comprise an input set of conductor strips, and further including forming a plurality of output conductor strips connected to the device, each said output conductor strip having essentially the same resistance.

29. The method of claim 28 further including forming each conductor strip of said input set in association with a respective conductor strip of said output set so that each said associated input and output conductor strip has a combined resistance essentially the same as the other associated input and output conductor strips.

30. A method of fabricating an insulated gate field effect transistor with electrostatic discharge protection, comprising the steps of:
   forming an elongate semiconductor moat of a first conductivity type;
   forming plural pairs of source and drain semiconductor regions in said moat, said regions being formed with a second conductivity type material and spaced apart to define a conduction channel therebetween;
   forming a gate conductor adjacent to but insulated from each said conduction channel;
   forming a separate resistive conductor strip in electrical contact with each said source semiconductor region;
   connecting said resistive conductor strips together to define an input of the device; and
   connecting said drain semiconductor regions together to define an output of the device.

31. The method of claim 30 further including forming said resistive conductor strips of a material having a positive temperature coefficient with respect to resistance.

32. The method of claim 30 further including forming said resistive strips to exhibit a resistance sufficient to protect that part of the device connected thereto from damaging electrostatic currents, and forming a desired number of said resistive conductor strips in parallel to achieve a desired total input resistance to the device.

33. The method of claim 30 further including forming a plurality of said semiconductor moats with a corresponding plurality of ones of said paired source and drain semiconductor regions, and connecting said resistive conductor strips of said source regions to said plurality of moats.

34. The method of claim 33 further including connecting all said drain regions together, and forming a plurality of said gate conductors associated with said source and drain semiconductor regions of said plurality of moats, and connection all said gate conductors together.

35. The method of claim 30 further including forming each said resistive conductor strip on a layer of thermally insulating material.

36. The method of claim 35 further including forming each said resistive conductive strip underlying a thermally insulating material.

37. A method of fabricating an output semiconductor transistor with electrostatic discharge protection, comprising the steps of:
   forming a plurality of sub-transistors each with an input, an output and a control terminal;
   forming a plurality of resistive conductor strips, each connected in parallel to an input of a respective said sub-transistor;
   connecting each said conductor strip together to define an input to the output semiconductor transistor;
   and connecting said control inputs together and said outputs together of said sub-transistors.

38. The method of claim 37 wherein said plurality of sub-transistors define a first row of sub-transistors, and further including a second row of other sub-transistors each with an input connected to a different one said resistive conductor strips.

39. The method of claim 37 further including forming a plurality of other resistive conductor strips and connecting the outputs of said sub-transistors together through said other resistive conductor strips.

* * * * *